United States Patent [19]

Denker

[11] 4,237,521

[45] Dec. 2, 1980

[54] HOUSING FOR ELECTRONIC ASSEMBLY INCLUDING INTERNALLY MOUNTED HEAT SINK

[75] Inventor: Jerry B. Denker, Cincinnati, Ohio

[73] Assignee: R. L. Drake Company, Miamisburg, Ohio

[21] Appl. No.: 9,665

[22] Filed: Feb. 5, 1979

[51] Int. Cl.³ .............................................. H05K 7/20
[52] U.S. Cl. ..................... 361/384; 62/408; 165/DIG. 16; 165/122; 165/128; 361/388
[58] Field of Search ................ 62/408; 165/DIG. 16, 165/128, 122, 129, 80 A, 80 B, 80 D; 174/15 R, 16 R, 16 HS; 361/382, 383, 384, 386, 388

[56] References Cited

U.S. PATENT DOCUMENTS

| | | | |
|---|---|---|---|
| 2,965,819 | 12/1960 | Rosenbaum | 357/82 |
| 2,984,774 | 5/1961 | Race | 357/82 |
| 3,201,654 | 8/1965 | Clark | 165/128 |
| 3,219,885 | 11/1965 | Schmiers | 174/16 HS |
| 3,462,553 | 8/1969 | Spranger | 361/383 |
| 3,592,260 | 7/1971 | Berger | 174/16 R |
| 3,730,264 | 5/1973 | Keylow | 165/128 |
| 3,780,798 | 12/1973 | Reimer | 165/128 |
| 3,971,877 | 7/1976 | Lee | 174/16 R |
| 4,027,206 | 5/1977 | Lee | 361/384 |

*Primary Examiner*—Gerald P. Tolin
*Attorney, Agent, or Firm*—Biebel, French & Nauman

[57] ABSTRACT

A heat sink (50), on which is mounted heat producing elements, such as transistors (40–43), is contained entirely within a cabinet (10) provided with openings (20, 27) positioned directly below and above the heat sink. The heat sink includes a rectangular plate (52) with the transistors mounted on one side and a plurality of integrally formed parallel fins (60) projecting laterally from the plate on the other side and extending diagonally thereacross. The heat sink may be convection cooled by air entering the openings (22) in the bottom of the cabinet and exiting through openings (27) in the top, or the heat sink may be forced air cooled by means of a fan (75) mounted the rear panel (16) which draws air through the openings (22) and across the fins (60).

5 Claims, 8 Drawing Figures

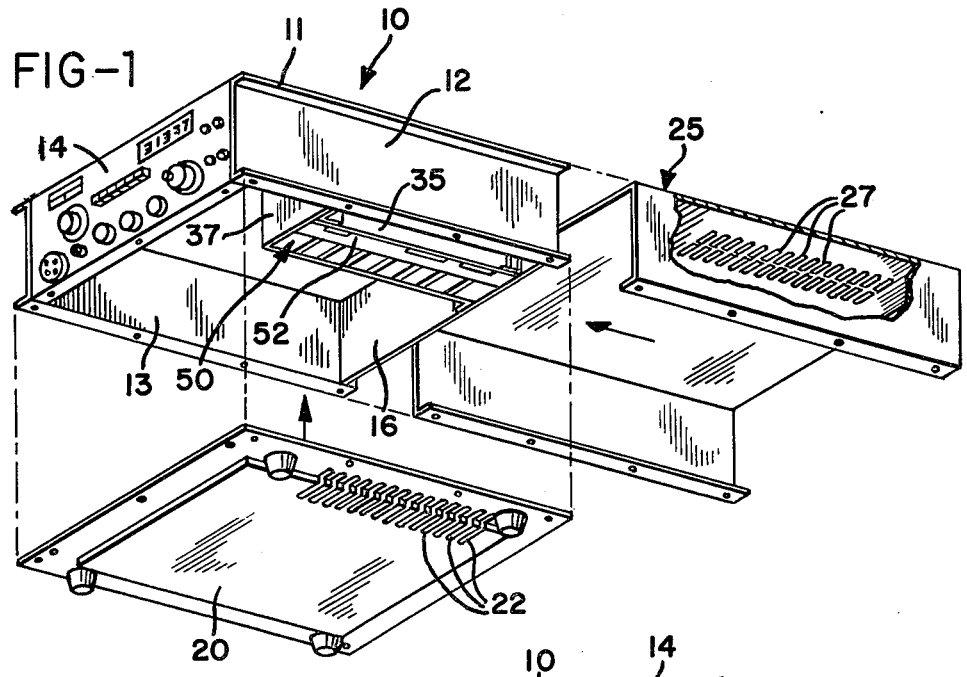
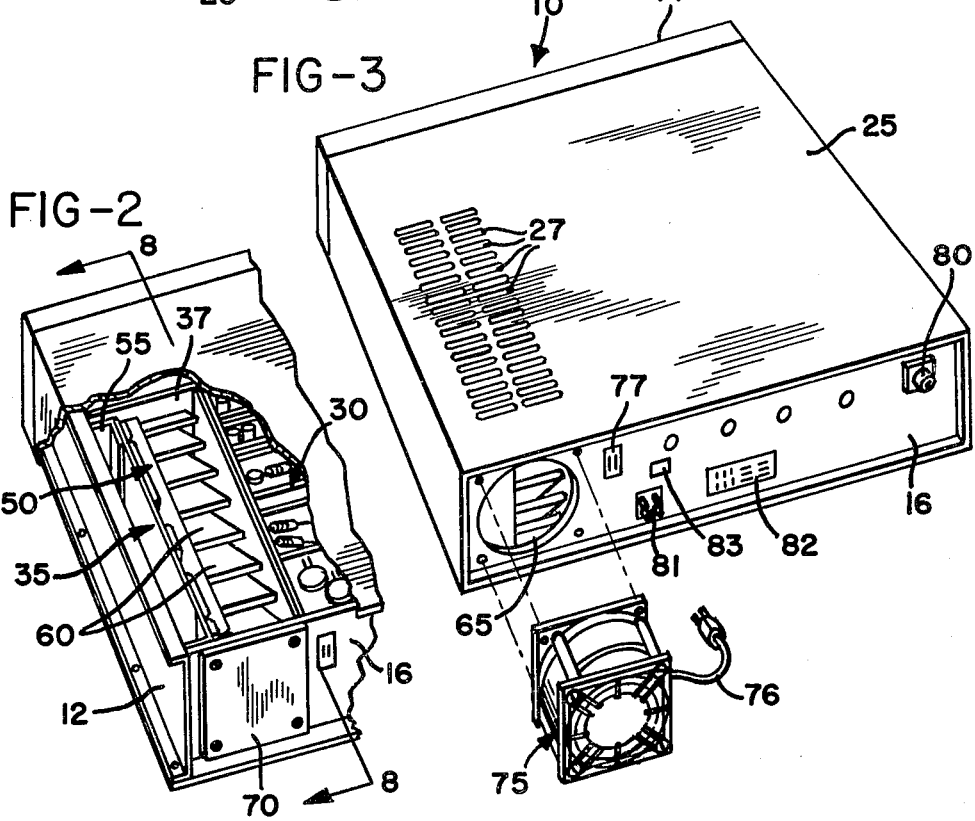

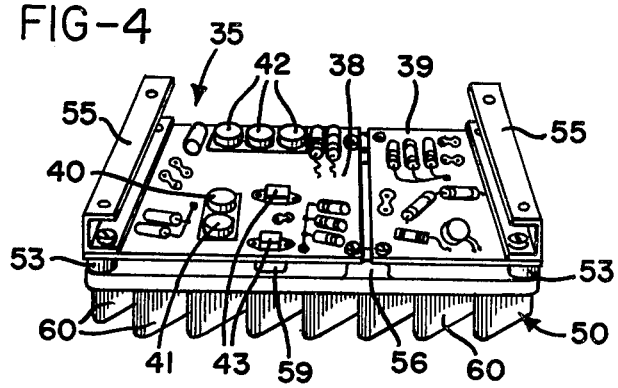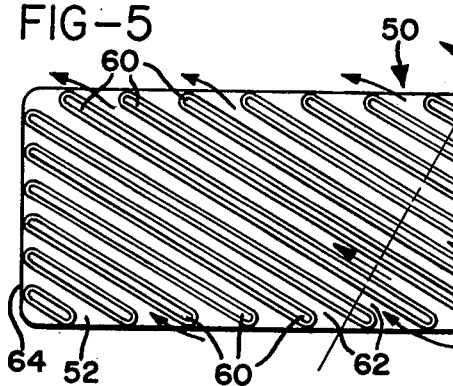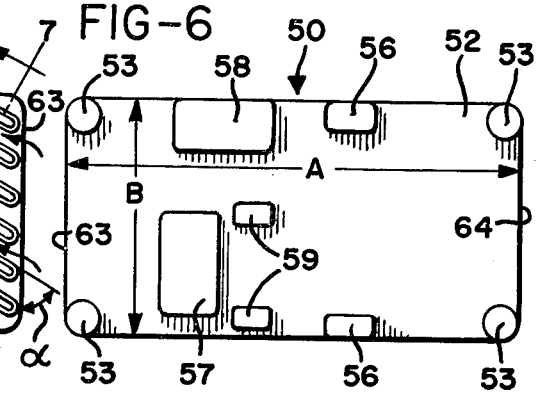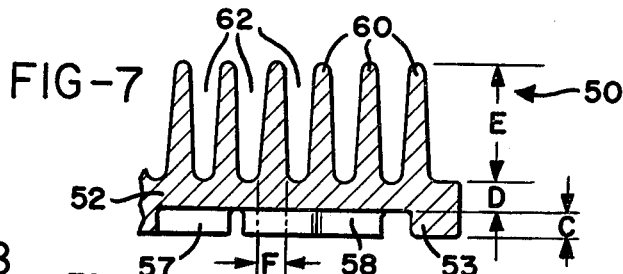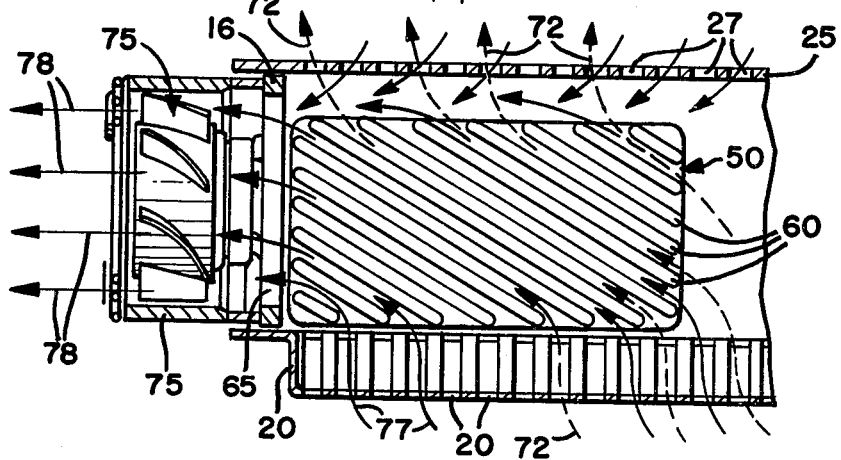

4,237,521

HOUSING FOR ELECTRONIC ASSEMBLY INCLUDING INTERNALLY MOUNTED HEAT SINK

BACKGROUND OF THE INVENTION

This invention relates to a heat sink for solid state power generating devices, such as the final amplifier or output transistors of a radio transmitter.

High power transistors are frequently mounted to heat sinks which absorb and dissipate to the ambient atmosphere heat generated in the transistor, thus allowing the transistor to operate for longer periods of time than would otherwise be possible. Frequently, heat sinks are mounted on the exterior of the electronic circuit package to provide maximum cooling effect. However, this exterior mounting exposed both the transistor and also the heat sink, which generally includes rows of vertically arranged fins, to possible damage. In addition, the appearance of such a device is sometimes adversely effected by this cooling arrangement, and the heat sink occupies space otherwise available for controls and connections.

SUMMARY OF THE INVENTION

This invention relates to an electronic assembly including a housing in which is contained at least one high power and heat generating transistor and its associated heat sink assembly entirely within the confines of the housing.

Basically, the electronic assembly, such as radio frequency transceiver, includes a substantially enclosed housing having a front cover containing dials, switches, meters, etc., and a rear cover including connectors, controls, switches and the like. The electronic assembly may include a chassis onto which printed circuit boards are mounted. One of the printed circuit boards will include the heat sink assembly constructed according to this invention. The chassis is enclosed by means of a bottom plate mounted directly to the chassis, and a U-shaped member or top cover which slides over the chassis to cover the sides and the top of the chassis.

A plurality of openings are formed in the top of the chassis and the bottom plate immediately above and below the heat sink so that air may enter into the openings in the bottom plate, pass inwardly across the heat sink and exit through the top openings in one mode of operation of the device. A removable plate is placed over an opening formed in the back wall of the chassis, and an optional fan may be mounted thereon to exhaust air from the interior of the chassis when continuous operation is desired. When the fan is installed, air is drawn through both the top and bottom openings, and the air which is drawn through the bottom openings is directed across the fins of the heat sink and is vented to the exterior of the chassis.

A radio transmitter or transceiver can be operated in several different modes of operation. When it is operated intermittently such as in the single sideband or CW modes, the average power output from the power amplifier is relatively low as compared to when it is operated continuously, such as in the radio teletype or slow scan television modes. Accordingly, for the intermittent type of operation, convection cooling of the power amplifier module would be sufficient whereas for continuous duty, it would be necessary to provide forced air cooling in order to keep the temperature of the transistors within acceptable levels.

Of course, a heat sink could be designed to dissipate all of the heat generated by the power transistor when operated continuously; however, this heat sink would be unnecessarily large and uneconomical, especially where the transceiver is used frequently in the sideband or CW modes.

It is also desirable that the transmitter or transceiver enclosure have a relatively low profile. This necessitates the placement of the exhaust fan in the horizontal plane, preferably at the rear of the housing or cabinet.

Traditionally, the heat sink is formed with a base member, usually a rectangular plate, having integrally formed fins with channels therebetween arranged vertically so that a chimney effect is achieved, that is, air is drawn into the space between the fins and flows thereacross by convection with the upward movement of the air being unimpeded by any obstructions, and the circulation of air effectively causing heat to be transferred from the fins to the air.

In the present invention, the channels formed by the fins are at an acute angle with respect to the vertical. While this is admittedly less efficient than vertical placement of such fins, it nevertheless allows the transmitter or transceiver to be operated with or without a cooling fan, depending upon the type of service contemplated by the operator.

Therefore, for intermittent service, and for short term continuous duty, convection cooling will be adequate while for long term continuous duty, a fan can be added to the rear of the chassis and forced air cooling of the heat sink accomplished, all without changing any of the internal arrangements of the components within the enclosure.

Accordingly, it is an object of this invention to provide a heat sink for use with electronic components comprising a rectangular plate of thermally conductive material, said plate including means for receiving heat generating devices in thermal relation thereto and further including a plurality of integrally formed parallel fins projecting laterally therefrom and extending diagonally thereacross, said fins forming channels therebetween through which cooling air may pass, whereby the heat sink may be installed in the vertical plane and cooled either by convection currents of air moving generally vertically upwardly from the fins or by air drawn generally horizontally away from the fins.

These and other objects and advantages of the invention will be apparent from the following description, the accompanying drawings and the appended claims.

BRIEF DESCRIPTION OF THE DRAWINGS

FIG. 1 is a perspective view of a radio transceiver with the covers removed to shown an internally mounted power module and associated heat sink;

FIG. 2 is a rear perspective view with a part of the top cover broken away to show the power module and associated heat sink;

FIG. 3 is a rear perspective view showing the vents and the top cover and an optional cooling fan;

FIG. 4 is a perspective of the power module showing printed circuit boards installed on a heat sink;

FIG. 5 is an elevational view of one side of the heat sink showing the laterally extending cooling fins;

FIG. 6 is an elevational view of the other side of the heat sink;

FIG. 7 is a cross sectional view taken along lines 7—7 in FIG. 5; and

FIG. 8 is a cross sectional view taken along lines 8—8 in FIG. 2.

DESCRIPTION OF THE PREFERRED EMBODIMENT

Referring to the drawings which show a preferred embodiment of the invention, and particularly to FIG. 1, electronic equipment, such as a radio transceiver, is contained within a cabinet 10 including a chassis 11 having side walls 12 and 13, a front panel 14, and a rear panel 16. The cabinet is enclosed by a cover including a bottom plate 20 secured to the chassis by means of screws. As shown in FIG. 1, the bottom plate 20 is provided with a plurality of openings or vents 22. The remainder of the chassis is covered by a U-shaped top cover 25 which slides over the side walls and completely encloses the interior contents of the cabinet. The top cover 25 is provided with openings 27 in its upper surface.

The interior of the cabinet includes a plurality of electronic components and printed circuit boards, shown generally at 30 in FIG. 2. Also contained within the interior of the cabinet is at least one heat producing device, such as a power amplifier module 35. The power amplifier module is separated from the remainder of the electronic circuitry by a sheet metal wall 37 which not only provides radio frequency and electrical isolation, but will also assist in directing cooling air across the module, as will be described.

The power amplifier module 35 may include one or more printed circuit boards 38 and 39, as shown in FIG. 4. These printed circuit boards have associated therewith one or more heat producing devices, such as the power amplifier transistors 40 and 41 and associated driver transistors 42 and 43.

The power amplifier module 35 is mounted on and associated with a heat sink 50, preferably formed of a highly heat conductive material, such as cast aluminum. The heat sink includes a rectangular plate 52, shown in FIGS. 4-8, one side being generally planar, but it is provided with a plurality of bosses to receive various components. Bosses 53 are formed at the corners to receive one edge of the printed circuit boards 38 and 39 and mounting brackets 55 (FIG. 4); bosses 56 receive the other edge of the printed circuit boards; and bosses 57, 58 and 59 are provided to receive in thermal relation the heat generating devices or transistors 40-43.

The other side of the heat sink 50 is provided with a plurality of integrally formed, parallel fins 60 projecting laterally outwardly from the plate 52 and extending diagonally across the plate to form channels 62 therebetween through which cooling air may pass. As shown in FIG. 5, the fins 60 are set at an angle of 60° with respect to the vertical edges 63,64.

The heat sink 50 and the power module 35 are mounted within the cabinet as shown in FIG. 2, with the openings 22 in plate 20 positioned directly below the fins 60 while the openings 27 are positioned directly above the fins.

Referring now to FIG. 8, when the heat sink 50 is installed in the cabinet, the plate 52 is oriented vertically. The fins may be cooled either by convection as air moves upwardly thereacross or by air drawn generally horizontally away from the fins by means of a fan.

In one mode of operation, where the power module is used in an intermittent or low average power level mode of operation, such as single side band transmission or CW, an opening 65 in the rear panel 16 is covered by a plate 70, and cooling air will enter through the slots 22 in the bottom plate 20 and will be carried upwardly by convection across the fins 60 and through the channels 62 formed therebetween, and thereafter exit through the openings 27 in the top cover 25, as shown by the dashed lines 72.

The angle $\alpha$ at which the fins are set with respect to the vertical do not provide the maximum efficiency for cooling; nevertheless, a chimney effect is achieved, and convection will provide sufficient cooling of the heat sink, although the heat sink in this case will be made slightly larger than if the fins were set vertically. However, this design permits the power module and heat sink to be installed in a low profile cabinet.

In another mode where continuous operation of the circuit is desired, a cooling fan 75 may be installed on the rear panel 16 after the cover 70 has been removed. The cooling fan includes a power cord 76 which can be inserted into a receptacle 77 provided on the back panel. In this configuration, the fan 75 will cause air to be drawn upwardly through the openings 22, across the fins 60 and through the channels 62, as shown by the solid lines 77, and then outwardly through the opening 65 and the fan 75. Some air, although not a significant amount, will also be drawn in through the openings 27.

The amount of cooling air, the speed of the fan and the area of the opening 65, are all designed to permit the heat generating devices or transistors 40-43 to operate continuously while maintaining the temperature level within acceptable limits.

In a preferred embodiment of the invention, the dimensions of the heat sink 50 are: A is 7.5 inches, B is 3.75 inches, C is 0.19 inch, D is 0.25 inch, E is 1.25 inch and F is 0.25 inch. The heat sink is preferably formed from aluminum.

Transistors 40 and 41 together will develop up to 150 watts of heat under normal operating conditions while the other transistors will generate approximately twenty watts. The heat sink is therefore required to dissipate a maximum of 170 watts. In one embodiment, transistors 40 and 41 have a maximum allowable case temperature of 134° C.

When using the heat sink 50 described above, the case temperatures of the transistors will not rise above 100° C. (when operating in an ambient environment of 25° C. or less) if the transistors develop not more than 80 watts, and no cooling fan is used, or if the transistors develop not more than 170 watts and a cooling 75 having a flow rate of 21 cfm in free air is used.

Thus, the power module with accompanying printed circuit boards, heat generating devices and heat sink are mounted entirely within a low profile cabinet, and both the heat generating devices and the heat sink fins are protected from damage. Also, the rear panel of the instrument is made available for other devices, such as connectors 80, 81 and 82, and control 83. The device may be used alternatively in an intermittent or low average power mode without the use of the cooling fan by utilizing the effects of convection currents, or it may be operated at higher power levels or in a continuous mode through the use of a cooling fan which draws air across the sink fins.

While the form of apparatus herein described constitutes a preferred embodiment of this invention, it is to be understood that the invention is not limited to this precise form of apparatus, and that changes may be made therein without departing from the scope of the invention which is defined in the appended claims.

What is claimed is:

1. An electronic device including a heat generating element comprising
    a low profile enclosure including a top cover, a bottom plate and front, rear and side walls,
    a heat sink contained entirely within said enclosure and including a body member having attached in thermal relation thereto the heat generating element and a plurality of fins extending laterally outwardly therefrom, said fins forming spaces therebetween through which cooling air may pass, said fins being set at an acute angle with respect to the vertical,
    means forming openings in said bottom plate so positioned with respect to the fins of said heat sink that ambient air may be drawn in through the openings in the bottom plate and pass over said fins,
    means forming openings in said top cover and positioned directly above said heat sink,
    means forming an opening in the rear or side wall of said enclosure, and means for mounting a fan to draw air through said opening
    whereby said heat sink may be cooled either by convection with the air passing over the fins and exiting through the openings in the top cover, or by causing the air to be drawn outwardly through the opening in the rear or side wall by means of the fan.

2. An electronic device including at least one heat generating element comprising
    an enclosure including a top cover, a bottom plate and front, rear and side walls,
    a heat sink contained entirely within said enclosure comprising a rectangular plate of thermally conductive material, one side of said plate being generally planar and including means receiving said heat generating element in thermal relation thereto, the other side of said plate including a plurality of integrally formed parallel fins projecting laterally therefrom and extending diagonally thereacross, said fins forming channels therebetween through which cooling air may pass,
    means supporting said heat sink within said enclosure with said planar side vertical,
    means forming openings in said bottom plate so positioned with respect to the fins of said heat sink that ambient air may be drawn in through the openings in the bottom plate and pass over the said fins,
    means forming openings in said top cover and positioned directly above said heat sink, and
    means forming an opening in the rear or side wall of said enclosure in alighment with said rectangular plate,
    whereby said heat sink may be cooled either by convection with the air passing over the fins and exiting through the openings in said top cover, or by causing the air to be drawn outwardly through the opening in said rear or side wall.

3. An electronic device of the type including an enclosed cabinet having means forming openings in the top and bottom of the cabinet and means forming an opening in the rear or side wall for a cooling fan, and heat sink means within the cabinet cooling at least some heat generating devices contained therein,
    wherein the heat sink means includes a rectangular plate of thermally conductive material, said plate including means receiving the heat generating devices in thermal relation thereto, and further including a plurality of integrally formed parallel fins projecting laterally therefrom and extending generally diagonally thereacross, said fins forming channels therebetween through which cooling air may pass, and
    means mounting said plate in a vertical plane and between the openings in the top and bottom of said cabinet and in alignment with the opening in the rear or side wall,
    the surface area of said fins and the angle at which they are set with respect to vertical being selected to permit adequate cooling of the heat generating devices connected in thermal relation thereto by convection currents of air moving generally upwardly from the fins when said components are operated intermittently, and by air drawn generally horizontally away from the fins by a cooling fan associated with the opening in the rear or side wall when said devices are operated continuously.

4. The apparatus of claim 3 wherein said plate is aluminum.

5. The apparatus of claim 3 wherein said fins are set at an angle of 60° C. with respect to the vertical.

* * * * *